(12) United States Patent
Debuisschert et al.

(10) Patent No.: US 12,241,177 B2
(45) Date of Patent: Mar. 4, 2025

(54) METHOD FOR MANUFACTURING A DEVICE COMPRISING A DIAMOND CRYSTAL

(71) Applicants: THALES, Courbevoie (FR); Centre national de la recherche scientifique, Paris (FR)

(72) Inventors: Thierry Debuisschert, Palaiseau (FR); Ludovic Mayer, Palaiseau (FR); Alexandre Tallaire, Palaiseau (FR); Jocelyn Achard, Ermont (FR); Ovidiu Brinza, Villetaneuse (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 18/556,088

(22) PCT Filed: Apr. 15, 2022

(86) PCT No.: PCT/EP2022/060169
§ 371 (c)(1),
(2) Date: Nov. 12, 2023

(87) PCT Pub. No.: WO2022/223485
PCT Pub. Date: Oct. 27, 2022

(65) Prior Publication Data
US 2024/0384434 A1    Nov. 21, 2024

(30) Foreign Application Priority Data

Apr. 19, 2021  (FR) ........................................ 2104022

(51) Int. Cl.
*C30B 29/04*  (2006.01)
*C30B 25/02*  (2006.01)
*C30B 33/00*  (2006.01)

(52) U.S. Cl.
CPC .............. *C30B 29/04* (2013.01); *C30B 25/02* (2013.01); *C30B 33/00* (2013.01)

(58) Field of Classification Search
CPC ......... C30B 29/04; C30B 25/02; C30B 33/00; G01R 23/163; G01R 23/17; G01R 29/0878; G01R 33/32; G01R 33/60
See application file for complete search history.

(56) References Cited

U.S. PATENT DOCUMENTS 10,571,498 B2 *  2/2020  Chipaux .............. G01R 23/163

FOREIGN PATENT DOCUMENTS

| FR | 3027681 A1 | 4/2016 |
| WO | 2017006092 A1 | 1/2017 |

OTHER PUBLICATIONS

FR 2104022, INPI Rapport de Recherche Preliminaire, Dec. 9, 2021, 2 pages.

(Continued)

*Primary Examiner* — Lee A Holly
(74) *Attorney, Agent, or Firm* — Soquel Group LLC (57) ABSTRACT

A method for manufacturing a device including a diamond crystal, the method including making available a substrate, growing a crystalline diamond layer on the substrate, the layer having a crystal lattice, the layer including at least a first set of XV centers in the crystal lattice, each XV center having a quantification axis, a main direction being defined for the first set, the quantification axes of the XV centers of the first set being parallel to the main direction, the normal direction being distinct from the main direction of the first set, removing a first part of the diamond layer in order to reveal a first face perpendicular to the main direction of the first set, and removing of a second part of the diamond layer in order to reveal a second face perpendicular to the first face.

13 Claims, 5 Drawing Sheets

(56) References Cited

OTHER PUBLICATIONS

International Search Report, PCT /EP2022/060169, Jul. 8, 2022, 2 pages.

* cited by examiner

METHOD FOR MANUFACTURING A DEVICE COMPRISING A DIAMOND CRYSTAL

CROSS-REFERENCE TO RELATED APPLICATIONS

This application claims benefit under 35 USC § 371 of PCT Application No. PCT/EP2022/060169 entitled METHOD FOR MANUFACTURING A DEVICE COMPRISING A DIAMOND CRYSTAL, filed on Mar. 16, 2022 by inventors Thierry Debuisschert, Ludovic Mayer, Alexandre Tallaire, Jocelyn Achard and Ovidiu Brinza. PCT Application No. PCT/EP2022/060169 claims priority of French Patent Application No. 21 04022, filed on Apr. 19, 2021.

FIELD OF THE INVENTION

The present invention relates to a method for manufacturing a device comprising a diamond crystal.

BACKGROUND OF THE INVENTION

Diamond crystals frequently include defects called "XV centers", which occur spontaneously during crystal growth, or can be generated artificially. Such defects are formed by an atom (X) substituted for a carbon atom in the crystal lattice and coupled to an adjacent vacancy (V). X is the generic symbol for the atom substituted for the carbon atom (e.g. N, Si, Sn, etc.).

Such centers can have a plurality of states depending on the charge thereof. For some states of charge, the structure of energy levels and the populations thereof are likely to be modified by the simultaneous application of an external magnetic field and a laser radiation. It has thus been proposed to use diamond crystals in many applications by taking advantage of such properties, e.g. in a device for frequency analysis of a radio frequency or a microwave, or further in quantum computers or repeaters. Document FR 3027681 A1 describes a device including a diamond crystal.

However, the effectiveness of such devices depends greatly on the polarization of the laser field and on the orientation of the magnetic field with respect to the axis of quantification of the XV centers, i.e. the axis between the vacancy and the substituted atom. More particularly, the efficiency is maximum when the direction of the laser beam and the orientation of the magnetic field are parallel to the quantification axis of each.

However, the preferential orientation of the XV centers in a diamond crystal is very difficult to control. Indeed, even if the growth of crystals from substrates with a specific crystal orientation makes it possible to obtain XV centers the axes of which are largely oriented in a preferred direction, such orientations do not lead to rapid growth and/or can only be obtained from substrates which are not are easily available. On the other hand, substrates which lead to rapid growth and stable facets do not allow XV centers to be obtained the axes of which have a preferential orientation and are, in particular, perpendicular or parallel to one of the faces of the crystal.

As a result, the diamond crystals used in the aforementioned applications do not make an easy alignment of both the magnetic field and of the laser possible with respect to the XV centers. A degraded performance results therefrom, caused by the interaction of misaligned XV centers with the magnetic field and the laser beam.

There is thus a need for a method for manufacturing a device of the aforementioned type for obtaining a better signal to noise ratio than for the devices produced by the methods of the prior art.

SUMMARY OF THE DESCRIPTION

To this end, a method is proposed for manufacturing a device comprising a diamond crystal, a first laser radiation generator and a second magnetic field generator, the first generator being configured for illuminating a first face of the crystal with laser radiation, the second generator being configured for changing a value of a magnetic field in at least a portion of the crystal, the method including the steps of:
supply of a substrate with a support face, a normal direction being defined, the normal direction being perpendicular to the support face,
growth of a diamond crystal layer on the support face, the layer having a crystal lattice, the layer comprising at least a first set of XV centers in the crystal lattice, each XV center being composed of an X atom substituted for a carbon atom and coupled to a vacancy V, the XV center being a color center in the crystal lattice, each XV center having a quantification axis, the quantification axis connecting the substituted atom to the vacancy, a main direction being defined for the first set, the axes of quantification of the XV centers of the first set being parallel to the main direction of the set considered, the normal direction being distinct from the main direction of the first set,
removal of a first part of the diamond layer so as to reveal the first face, the first face being perpendicular to the main direction of the first set,
removal of a second part of the diamond layer in order to reveal a second face, the second face being perpendicular to the first face, and
positioning, with respect to the diamond crystal, the first generator in a first position and the second generator in a second position, the first generator being configured so that the laser radiation is perpendicular to the first face when the first generator is in the first position, the second generator being configured so that the magnetic field is parallel to the main direction when the second generator is in the second position.

According to advantageous, yet not mandatory embodiments, the method includes one or a plurality of the following features, taken individually or according to all technically possible combinations:
the normal direction is a direction [100] of the diamond crystal.
the normal direction is chosen from a direction [110] and a direction [113] of the diamond crystal.
the second face is perpendicular to a [2-1-1] direction of the diamond crystal.
the second face is perpendicular to a direction [11-2] of the diamond crystal.
the second face is perpendicular to a direction [110] of the diamond crystal.
the main direction is a direction [111] or a direction [-1-11] of the diamond crystal.
the method further includes a step of removing a third part of the diamond layer in order to reveal a third face parallel to the second face.
the diamond crystal is a blade extending in a plane parallel to the second face and to the third face, the blade being delimited along a direction perpendicular to the plane by the second face and the third face.

the diamond layer has a thickness less than or equal to 2 millimeters.

the growth step is a step of growth by chemical vapor deposition.

at least one removal step includes removing part of the diamond layer by laser cutting.

the method further includes a step of removal of a third part of the diamond layer in order to reveal a third face, the third face being perpendicular to the main direction of the first set, the diamond crystal being delimited along the main direction of the first set by the first face and by the third face.

BRIEF DESCRIPTION OF THE DRAWINGS

The features and advantages of the invention will appear upon reading the following description, given only as an example, but not limited to, and making reference to the enclosed drawings, wherein.

DETAILED DESCRIPTION OF EMBODIMENTS

Figure 1:
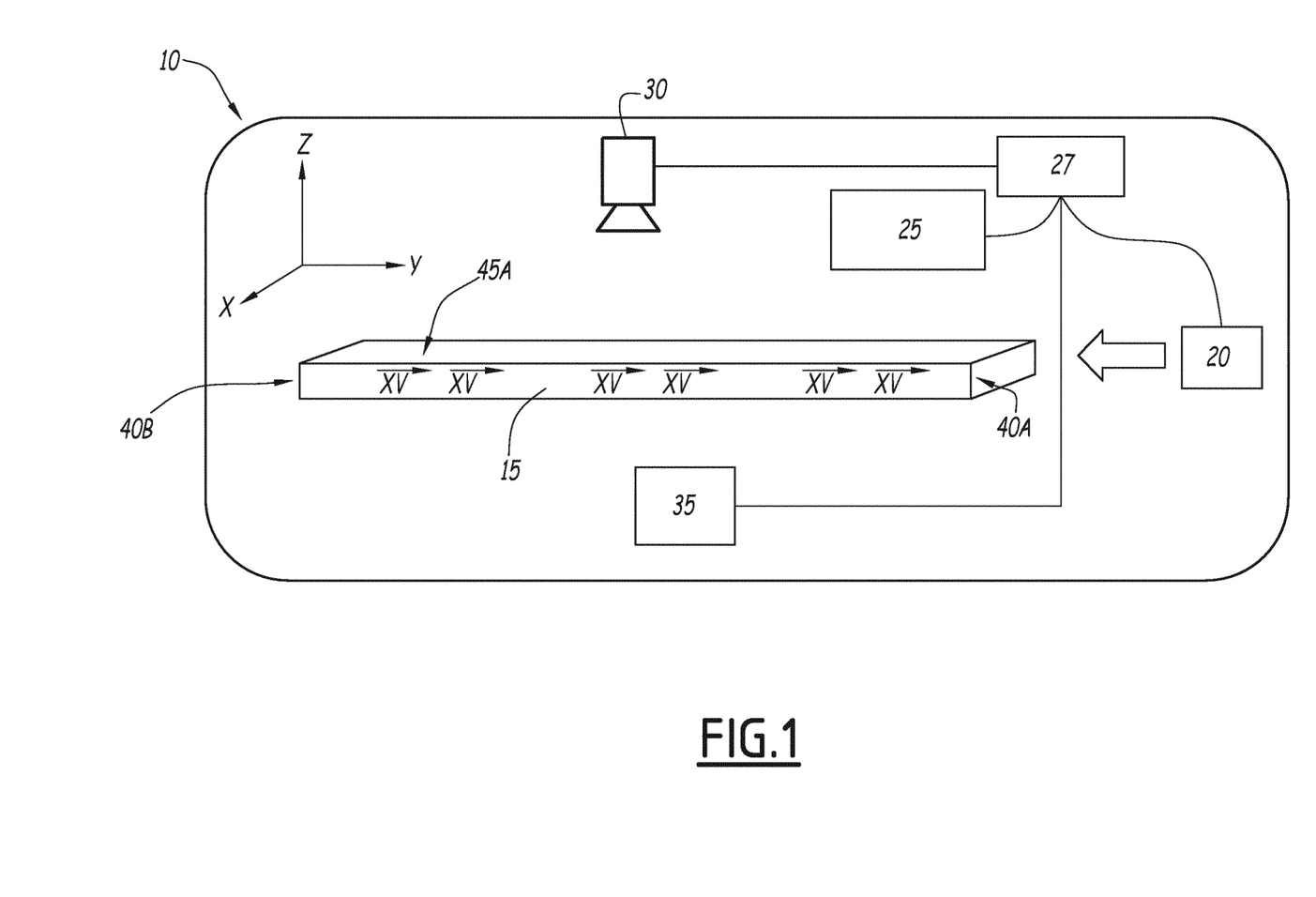
FIG. 1 is a schematic representation of an example of device produced by a method according to the invention, comprising a diamond crystal.

A device 10 is shown in FIG. 1.

The device 10 includes at least one diamond crystal 15, a first laser radiation generator 20 and a second magnetic field generator 25.

Many devices 10 use the properties of diamond crystals 15 exposed to a laser radiation and a magnetic field in order to perform various functions.

For example, the device 10 is a quantum computer or a quantum repeater, wherein portions of the diamond crystal 15 have XV centers which act as unit quantum information bricks, or "qubits".

In a variant, the device 10 is a quantum sensor. In such case, the XV centers placed in the device 10 have the properties thereof modified by an external parameter. Such modification can be detected, which is the measurement signal. The XV centers make it possible in particular to characterize objects at the nanoscale, e.g. structures of a single molecule, of a ferromagnetic domain, or further to form a read head for a magnetic storage disk, among others.

The example of a device 10 acting as a spectrum analyzer will be presented in detail hereinafter. The spectrum analyzer which will be described hereinafter is an example of a quantum sensor.

However, it should be noted that other types of devices 10 fulfilling other functions can also be envisaged.

The analysis device 10 is suitable for analyzing a signal.

In the context of the invention, the term "analyze" refers to one of the following actions: identifying the frequencies of frequency components of a signal and determining the amplitudes of frequency components of a signal.

The analysis device 10 is thereby suitable for identifying the frequencies of frequency components of a signal and suitable for determining the amplitudes of frequency components of a signal.

The analysis device 10 is thereby a spectrum analyzer.

In the example described, the analysis device 10 is a device for analyzing a microwave signal, a microwave signal having a frequency between 1 MHz and a few 100 GHz.

The device 10 further includes a control module 27, an imager 30 and an excitation element 35.

The diamond crystal 15 has a crystal lattice.

The diamond 15 is a wide bandgap semiconductor having a valence band and a conduction band. The presence of crystalline defects or color centers creates discrete energy levels within the band vacancy.

The crystal 15 comprises at least a first set of XV centers in the crystal lattice. For example, the crystal 15 comprises a single set of XV centers.

In a variant, the crystal 15 comprises a plurality of distinct sets of XV centers, which will be described in detail thereafter.

The XV centers are present near the surface or in the volume.

A XV center is an isolated defect in the crystal lattice of the diamond, formed by an atom which substitutes for a carbon atom and to which a vacancy is coupled in an adjacent site of the crystal lattice (V for "vacancy").

More particularly, each substituted atom is an atom of column IV, in particular an atom of silicon (Si), of germanium (Ge), of tin (Sn), or further of lead (Pb), or yet a nitrogen atom (N). Hereinafter, we will preferentially consider the centers consisting of a nitrogen atom and of a vacancy called "NV centers".

The creation of XV centers in diamond can be obtained in synthetic crystals made by a CVD (Chemical Vapor Deposition) process. When well controlled, such process makes it possible to manufacture crystals with sizes up to a few millimeters (mm) on a side.

The XV centers can be created by ion implantation of atoms, in particular nitrogen. The diamond is then annealed (800° C.) so that the vacancies recombine with the substituted impurities to form the XV centers.

The XV centers can also be produced by incorporating atoms, in particular nitrogen, in a controlled manner during diamond growth, using the "in-situ doping" method. The XV centers are produced in the volume or in uniform layers near the surface.

The set of a substituted atom plus a vacancy, which forms the XV center is thereby an "artificial atom", incorporated within the diamond matrix and detectable on an individual scale.

The XV center can exist with a plurality of different charge states. The state used in the example described is the XV center$^-$, which has captured an additional electron from the neutral state thereof. The XV center$^-$ has an electron spin resonance corresponding to the transitions between the level $m_s=0$ and the levels $m_s=-1$ and $m_s=+1$ of the fundamental level $^3A_2$ and the excited level $^3E$. In the absence of a magnetic field, the levels $m_s=-1$ and $m_s=+1$ are degenerate. The application of an external magnetic field results in lifting the degeneration by the Zeeman effect between the spin levels $m_s=-1$ and $m_s=1$, both for the fundamental level $^3A_2$ and the excited level $^3E$. The Zeeman effect results from a coupling between the external magnetic field and the magnetic moment of the electrons resulting in removing the degeneration. The diamond crystal 15 has at least one region including a plurality of sub-regions each having a resonant frequency between the energy levels of the XV center wherein, for each of the sub-regions, when the sub-region is in the presence of optical excitation, the charges are transferred from one spin level to another (Optical Detection of Magnetic Resonance, ODMR) or transferred into the conduction band (Photoelectrical Detection of Magnetic Resonance, PDMR). In the presence of a microwave signal having at least a frequency equal to the resonance frequency of the sub-region, the population of spin levels is modified. The above results in a variation in luminescence (ODMR) or a variation in the amount of charges transferred in the conduction band (PDMR).

The XV centers each have a quantification axis along the directions <111> of the crystal. As a result, due to the cubic symmetry, 4 families (or "sets") of XV centers co-exist, the axes of the XV centers of each family being parallel to one of the directions <111> of the crystal.

The axes of the XV centers of one of the families, called the "first set", are represented in FIG. 1 by arrows. In order not to clutter the figure, the axes of the XV centers of the other families are not shown in FIG. 1.

Hereinafter in the description, the direction <111> associated with a family of XV centers is called the "main direction" of the family.

The main directions are e.g. [111], [1-11], [−111] or [11-1] as defined for the crystal lattice of the diamond 15, the four directions being equivalent to each other. In general, the distribution of all NV centers is random according to the 4 directions, giving rise to a probability of 25% for each of them. Nevertheless, in some cases, a preferential distribution according to one or a plurality of the directions can be observed as a function e.g. of the conditions of synthesis for the crystal.

As will become apparent thereafter, the diamond crystal 15 is designed in such a way that the quantification axes of one of the 4 sets of NV centers (e.g. same corresponding to the direction [111]) are oriented along a direction which is advantageous for the device 10.

The crystal 15 has at least a first face 40A and a second face 45A.

Advantageously, the crystal 15 has a planar geometry, the plane including two directions perpendicular to each other indicated by the axes X and Y in FIG. 1. Hereinafter, the first direction is called the first direction X and the second direction is called the second direction Y.

A third direction Z perpendicular to the directions X and Y is also defined.

For example, the crystal 15 is parallelepipedal.

In a variant, the shape of the crystal 15 is arbitrary, but has at least a first face 40A and a second face 45A.

The main direction of the first set is e.g. parallel to the direction Y.

The first face 40A is perpendicular to the main direction of the first set, i.e. in the present case perpendicular to the second direction Y.

The second face 45A is perpendicular to the first face 40A. More particularly, the second face 45A is perpendicular to the third direction Z.

The diamond crystal 15 extends along the main direction of the first set in a plane perpendicular to the third direction Z.

According to one embodiment, the diamond crystal 15 is delimited along the direction Z by two second faces 45A and 45B parallel to each other and, along the direction Y, by two first faces 40A and 40B parallel to each other.

Each second face 45A, 45 B is e.g. perpendicular to a direction [11-2] of the diamond crystal 15.

For example, each face of the diamond crystal 15 is perpendicular to one of the directions X, Y or Z.

A length is defined for the diamond crystal 15, measured along the direction Y. For example, the length is measured between the first two faces 40A, 40 B.

The length is e.g. greater than or equal to 1 mm, in particular comprised between 1 and 15 mm.

A thickness is defined for the diamond crystal 15, measured along the direction Z. For example, the thickness of the diamond crystal 15 is measured between the two second faces 45A, 45B.

The thickness is e.g. comprised between 100 micrometers (µm) and 5 mm.

A width of the diamond crystal, measured along the X direction, is e.g. comprised between 1 mm and 15 mm.

The diamond crystal 15 is, in particular, a blade delimited along the direction Z by the two second faces 45A, 45 B.

In particular, "blade" means that the length of the diamond crystal 15 is greater than or equal to 5 times the thickness of the diamond crystal 15, in particular greater than or equal to 10 times the thickness of the diamond crystal 15. More particularly, the width of the diamond crystal 15 is also greater than or equal to 5 times the thickness of the diamond crystal 15, in particular greater than or equal to 10 times the thickness of the diamond crystal 15.

It should be noted that the shape of the diamond crystal 15 is likely to vary, e.g. if the width of the diamond crystal 15 is less than or equal to 5 times the thickness.

The first generator 20 is configured for generating a laser radiation and for illuminating at least a first face 40A of the crystal 15 with the laser radiation when the first generator 20 is in a first operating position.

The first generator 20 includes e.g. a laser diode. It should be noted that types of laser radiation emitters other than diodes are conceivable.

The first generator 20 is configured so that, when the first generator 20 is in the first operating position, the laser radiation propagates in a direction perpendicular to the first face 40A that the laser radiation is intended to illuminate.

The laser radiation propagates e.g. along the direction Y.

The laser radiation is a radiation apt to cause a luminescence of the XV centers of the diamond crystal 15 when the laser radiation is absorbed by the XV centers.

Laser radiation has a wavelength. The wavelength is comprised e.g. between 400 nm and 600 nm.

According to one embodiment, the diamond crystal 15 forms a waveguide suitable for guiding the laser radiation from the face 40A to the face 40B, e.g. by reflection on the two second faces 45A and 45B.

The second generator 25 is configured for changing a value of a magnetic field B of at least a portion of the diamond crystal 15 when the second generator 25 is in a second operating position.

More particularly, the second generator 25 is configured for modifying a value of a magnetic field B in at least a portion of the diamond 15.

More precisely, the second generator 25 is configured so that the magnetic field B has a spatial variation of amplitude in the volume of the diamond 15.

In particular, the magnetic field B has a spatial variation of amplitude along the main direction of the first set of XV centers, i.e. herein the direction Y.

Advantageously, the spatial variation of the amplitude of the magnetic field is monotonous.

According to one embodiment, the spatial variation is a linear variation.

For example, the second generator 25 is suitable for applying a field gradient of several hundred T/m.

According to a particular case, the second generator 25 is a neodymium magnet. In a variant, the second generator 25 is an electromagnet.

The magnetic field is in particular a magnetic field oriented along the main direction of the first set of XV centers, i.e. herein the direction Y.

The control module 27 is configured for controlling the emission of the laser radiation by the first generator 20.

Furthermore, the control module 27 is configured for controlling the modification of the magnetic field value(s) B by the second generator 25, in particular for controlling the generation of the spatial variation in amplitude of the magnetic field B by means of the second generator 25.

Furthermore, the control module 27 is also configured for controlling the acquisition, by the imager 30, of at least one image, e.g. in the case of the ODMR.

The imager 30 is configured for acquiring images of at least a second face 45A of the diamond crystal 15. More particularly, the imager 30 is configured for acquiring images of the second face 45A, the second generator 25 of which is configured for modifying values of the magnetic field B.

The imager 30 is configured for transmitting each acquired image to the control module 27.

The excitation element 35 is e.g. configured for exciting the diamond crystal 15 with a signal to be analyzed.

For example, the excitation element 35 is configured for modifying values of an electromagnetic field in at least a portion of the diamond crystal, in particular in the second face 45A, the second generator 25 of which is configured for modifying values of the magnetic field B.

The excitation element 35 includes e.g. an antenna arranged close to the diamond crystal 15, in particular close to the second face 45A, the second generator 25 of which is configured for modifying magnetic field values B, and configured for transmitting the signal to be analyzed.

It should be noted that other types of excitation elements are also conceivable.

The operation of the device 10 will now be described.

In a manner known per se, the signal to be analyzed is emitted by the excitation element 35, the laser radiation and the spatial variation in amplitude of the magnetic field B being simultaneously generated by the first generator 20 and the second generator 25.

Under the influence of the laser radiation, the XV centers of the diamond crystal 15 exhibit luminescence at a given wavelength (637 nm e.g. in the case of NV centers). However, the XV centers, which have a resonance frequency equal to a frequency of the signal to be analyzed, have a reduced luminescence compared to the other zones. Such variation of contrast, which is the basis of the ODMR, is used herein for analyzing a wide frequency range, in particular in the microwave range.

Thereby, each portion of the diamond crystal 15, and in particular of the second face 45A the second generator 25 of which is configured for modifying values of the magnetic field B, exhibits reduced luminescence compared with the other zones if the signal to be analyzed has a frequency component at the resonant frequency of the XV centers of said portion.

Since the resonance frequency is a function of the value of the magnetic field B, it follows that different zones of the diamond crystal 15, and in particular of the second face 45A, the second generator 25 of which is configured for modifying the values of the magnetic field B, exhibit reduced luminescence when excited by components with different frequencies.

When the imager 30 acquires images of the diamond crystal 15, in particular of the second face 45A, the second generator 25 of which is configured for modifying values of the magnetic field B, it is thus possible to associate each zone of the image with a frequency, and to identify the presence of a frequency component having said frequency in the signal to be analyzed when a reduced luminescence of said zone compared to the other zones is visible in the image. Furthermore, it is possible to correlate the intensity of the luminescence visible on the image with the amplitude of the frequency component in the signal to be analyzed.

Thereby, the device 10 acts as a spectrum analyzer.

Figure 2:
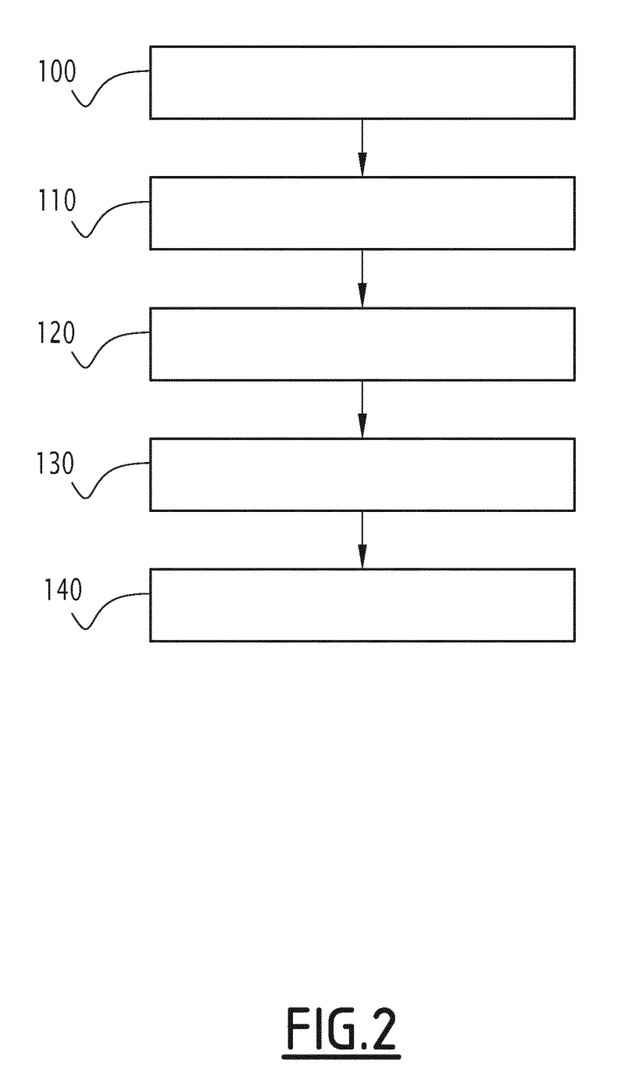
FIG. 2 is a flow diagram of the steps of an example of method according to the invention.

The method for manufacturing the device 10 will now be described with reference to FIG. 2 which shows a flowchart of the steps of such method.

It should be noted that the method described is applicable to any type of device including a diamond crystal 10 and two generators 20 and 25, and not only to a spectrum analyzer.

The method includes a supply step 100, a growth step 110, a removal step 120, a removal step 130 and a positioning step 140.

During the provision step 100, a substrate 50 is provided.

The substrate 50 is made of a substrate material.

The substrate material is e.g. diamond. More particularly, the substrate 50 is a diamond single crystal.

More particularly the diamond single crystal is obtained by a CVD growth process on a seed which is itself a single crystal, or on a hetero-substrate.

Substrate 50 has a support face 55.

The substrate 50 is e. g. parallelepipedal.

For example, the support face 55 is square and has a side length comprised between 2 mm and 15 mm, e.g. equal to 3 mm.

The support face 55 is flat.

A normal direction N defined for the support face 55. The normal direction N is perpendicular to the support face 55.

During the growth step 110, a crystalline diamond layer 60 grows on the support face 55.

For example, the crystalline diamond layer 60 is deposited on the support face 55 by chemical vapor deposition.

In a typical CVD process for diamond growth, the substrate is exposed to one or a plurality of gas phase precursors, which react and/or decompose on the surface of the substrate, in order to generate the desired deposition. Frequently, the gas phase is thermally activated, e.g. by the use of a plasma source in a resonant microwave cavity or by a filament heated to high temperature by the Joule effect.

The growth step 110 includes e.g. the injection of compounds containing atoms, of nitrogen, of silicon, of germanium, of tin or of lead, so as to generate XV centers in the crystalline layer 60.

The support face 55 is configured so that the crystalline layer 60 grows on the support face 55, the normal direction N being coincident with a predefined direction of growth of the crystalline layer 60. For this purpose, the substrate 50 has e.g. a crystalline lattice identical to the crystal lattice of the crystalline layer 60 which it is desired to grow. The above is called homoepitaxial growth. In some cases, such lattice is not perfectly identical and composed of elements different from the lattice of the layer to be deposited, which is called heteroepitaxial growth.

The crystal layer 60 is intended for forming the diamond crystal 15 after the removal of at least a portion of the crystal layer 60. More particularly, the crystalline layer 60 has the crystal lattice of the diamond crystal 15 and includes the set(s) of XV centers which will be present in the diamond crystal 15 at the end of the manufacturing process.

Figure 3:
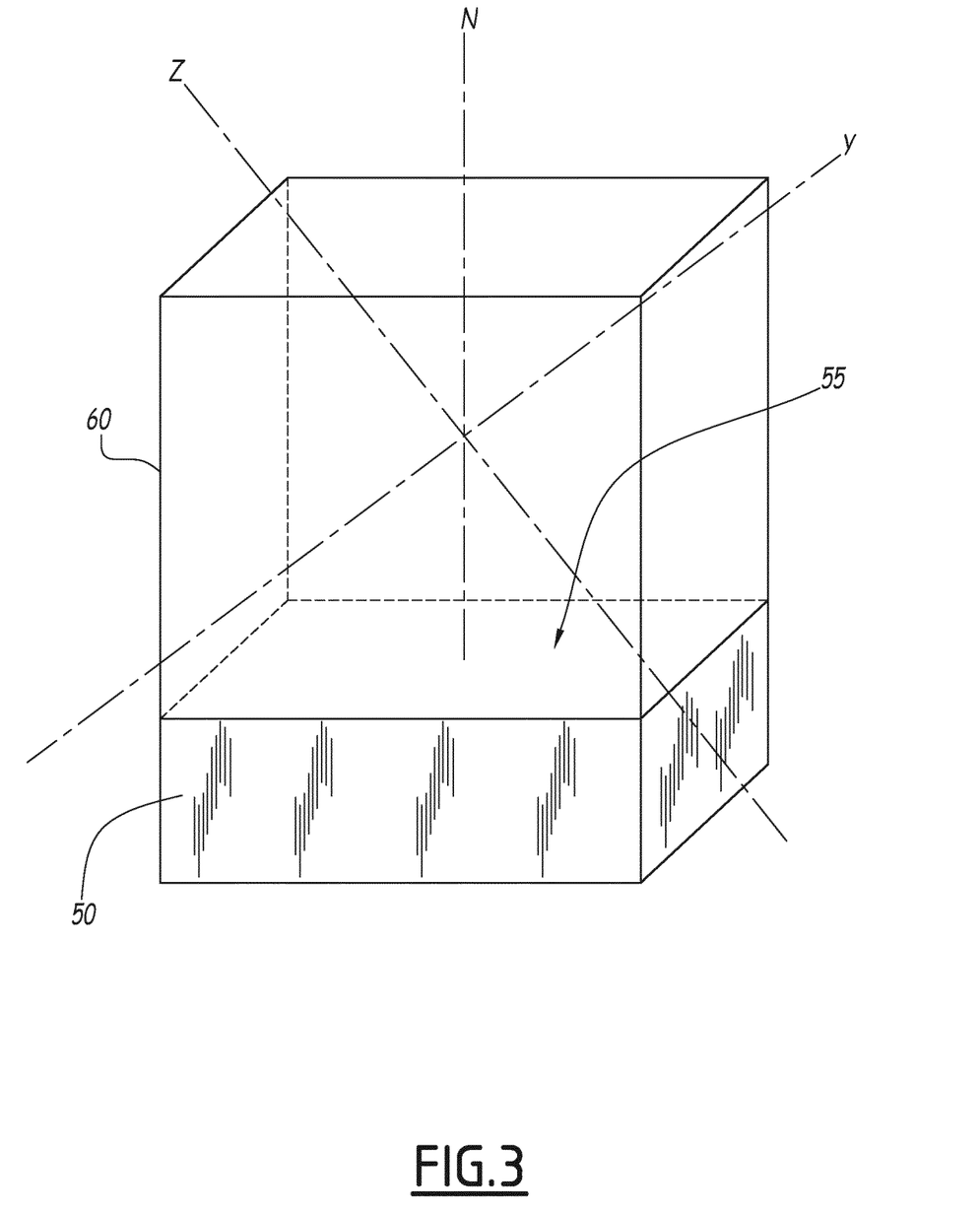
FIG. 3 is a schematic representation of a crystalline layer obtained during the method shown in FIG. 2.

The layer 60 is shown, in particular, in FIG. 3.

For example, the support face 55 is configured so that the normal direction N is coincident with a direction [100] of the crystalline layer 60.

In a variant, the support face 55 is configured so that the normal direction N is coincident with a direction [110] of the crystalline layer 60.

According to another variant, the support face 55 is configured so that the normal direction N coincides with a direction [113] of the crystalline layer 60.

The normal direction N is thus distinct from the main direction of the first set of XV centers. The above means in particular that an angle between the normal direction N and the main direction of the first set is strictly greater than zero degrees.

Furthermore, the normal direction N forms an angle strictly less than 90 degrees (°) with the main direction of the first set.

For example, when the normal direction N is a direction [100] of the crystalline layer 60, an angle between the normal direction N and the main direction of the first set (parallel to the direction Y) being equal to 54.74 degrees (°).

When the normal direction N is a direction [110] of the crystal layer 60, an angle between the normal direction N and the main direction of the first set is 35.26°.

When the normal direction N is a direction [113] of the crystal layer 60, an angle between the normal direction N and the main direction of the first set is 29.5°.

A thickness is defined for the crystalline layer 60. The thickness of the crystalline layer is measured along the normal direction N. The thickness of the crystalline layer 60 is e.g. greater than or equal to 2 mm, in particular comprised between 2 mm and 5 mm.

During the step 120, a first portion of the crystalline layer 60 is removed so as to expose the first face(s) 40.

For example, the crystalline layer 60 is cut by laser cutting in a plane perpendicular to the main direction, in particular by a laser beam contained in a plane perpendicular to the direction Y.

The laser beam is e.g. generated by a YAG laser using yttrium and aluminum garnet, or else a $CO_2$ laser. However, other types of lasers are also conceivable.

Optionally, the step 120 includes a step of polishing the first face(s) 40A, 40 B.

The polishing is carried out e.g. by placing the crystalline layer on a turntable, e.g. at about 4000 revolutions per minute, and by polishing the face 40A, 40B with diamond powder.

During the removal step 130, at least a second portion of the diamond layer 60 is removed in order to expose the second face(s) 45A, 45 B. For example, the second portion or portions are removed by laser cutting of the diamond layer 60.

For example, two laser cuts are made, each laser cut being made using laser radiation contained in a plane perpendicular to the direction Z, a distance between the two planes being equal to the thickness of the diamond crystal 15 which is desired to be obtained.

Figure 4:
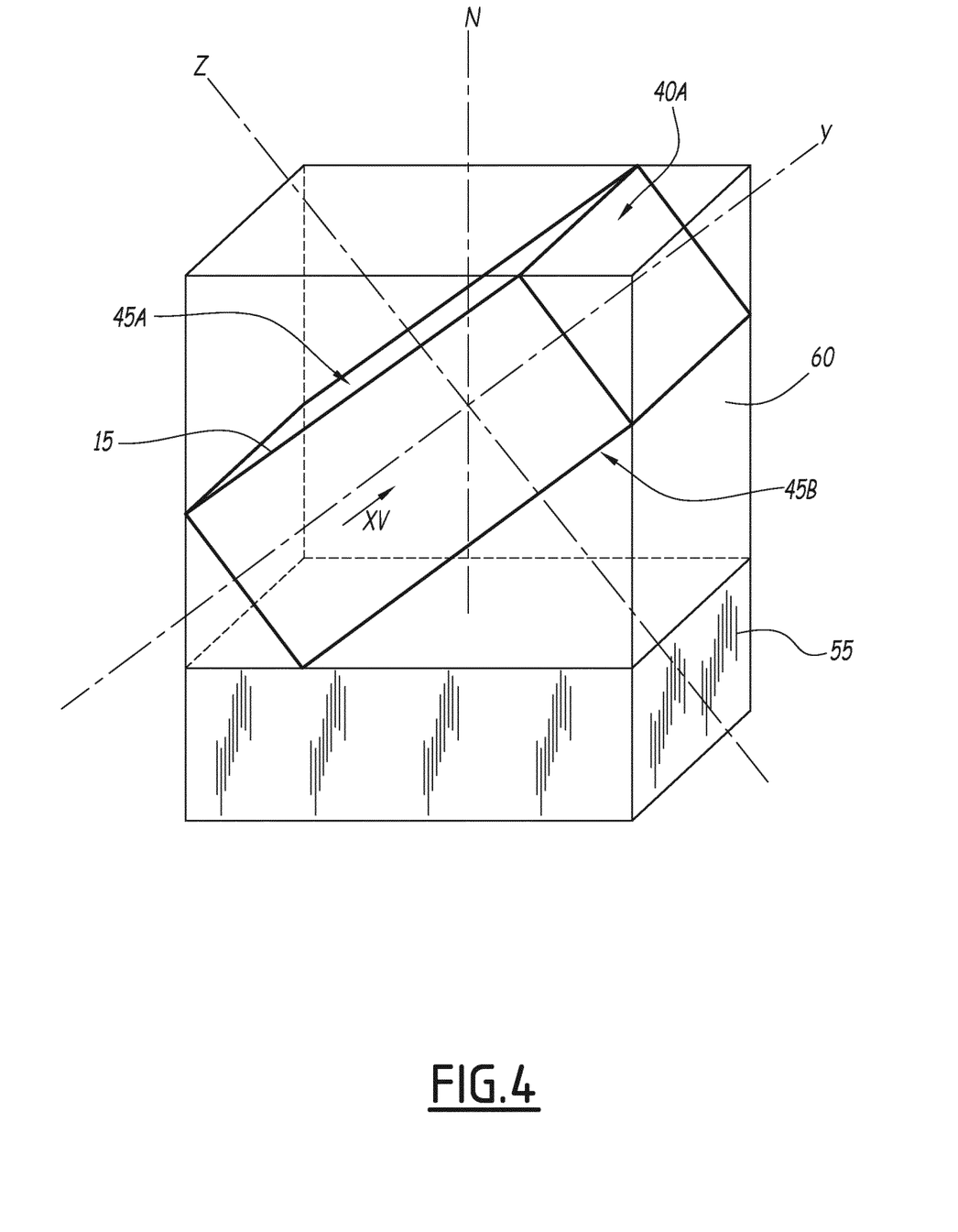
FIG. 4 is a schematic representation showing the production of an example of the crystal of FIG. 1 during the method shown in FIG. 2, from the crystalline diamond layer shown in FIG. 3.

Thereby, the diamond crystal 15 is obtained, as can be seen in FIG. 4.

Optionally, a plurality of laser cuts are made, each one being made using a laser radiation contained in a plane perpendicular to the direction Z, so as to obtain a plurality of diamond crystals 15.

Optionally, the step 130 includes a step of polishing the second face(s) 45A, 45 B. The polishing of the second face(s) 45A, 45 B is e.g. carried out in the same way as the polishing of the first face(s) 40A, 40 B.

During the positioning step 140, the first generator 20 is positioned in the first position thereof and the second generator 25 is positioned in the second position thereof, with respect to the diamond crystal 15.

For example, the diamond crystal 15, the first generator 20 and the second generator 25 are attached to a casing of the device 15. In addition, the first generator 20, the second generator 25, the imager 30 and the excitation element 35 are connected to the control module 27.

By means of the invention, a diamond crystal 15 is obtained having at least a first face 40A perpendicular to the main direction of the XV centers of the first set and a second face 45B perpendicular to the first face 40A. More particularly, the method does not presume the growth, which is difficult to obtain, of a crystalline layer 60 along the main direction of the XV centers or along a direction perpendicular thereto (e.g. along the direction Z).

Furthermore, due to the orientation of the faces 40A and 45A, it is easy to couple the laser generated by the first generator 20 to the XV centers through the first face 40A, and to apply the magnetic field B, by means of the second generator 25, to the same XV centers. Thereby, the axis of the XV centers is aligned with the direction of the magnetic field B and with the direction of propagation of the laser. A good signal-to-noise ratio of the device 10 and thus improved performance result therefrom.

The substrates 50 allowing growth along the directions [100], [110] or [113] are the easiest to obtain. Furthermore, the crystalline layers 60 which grow along said directions are generally of good quality, since the faces are relatively stable during growth. It should also be noted that an additional advantage of substrates made from growths on crystalline orientations such as [110] or [113] is that of having a preferential alignment of the XV centers along a particular direction. The probability of orientation according to said direction can typically lie between 50% and 80%. In such case, it is then possible to maximize the coupling to a single family of centers of interest while limiting the background signal related to the luminescence of the other families.

When two faces 45A, 45B parallel to each other are formed on the diamond crystal 15, the removal step 130 can be carried out several times successively, in order to obtain, from the same diamond crystal layer 60, a plurality of diamond crystals 15. When the diamond crystal 15 is a blade, relatively thin compared to the length thereof, a greater number of diamond crystals 15 can be obtained from the same diamond crystal layer 60.

Chemical vapor deposition is a technique for obtaining diamond layers 60 of good quality and with a well-controlled concentration of color centers. It should be noted that other growth methods are likely to be used.

It should be noted that chemical vapor deposition is generally used for the growth of thin layers of material, and not layers having a thickness of 2 mm or more, as is the case in certain embodiments of the invention. Such layers 60 make it possible to obtain diamond crystals 15 having lengths of 3 mm or more, making it possible in particular to cover a large spectral range when the device 10 is a spectrum analyzer.

Laser cutting is a method for making precisely defined faces 45A, 45B, 40A, 40B appear in a relatively simple and rapid way.

The optical polishing of the two faces 40A and 40B allows the beam to enter through one of the faces and to exit through the other face. An uncontrolled diffusion of the beam on the exit face is thereby prevented. Thereby, the transmitted laser beam can be measured for controlling the intensity of the laser. It is also possible to make two laser beams (if appropriate, of different wavelength) enter through each of the faces, which could be useful in particular for implementing the PDMR.

Figure 5:
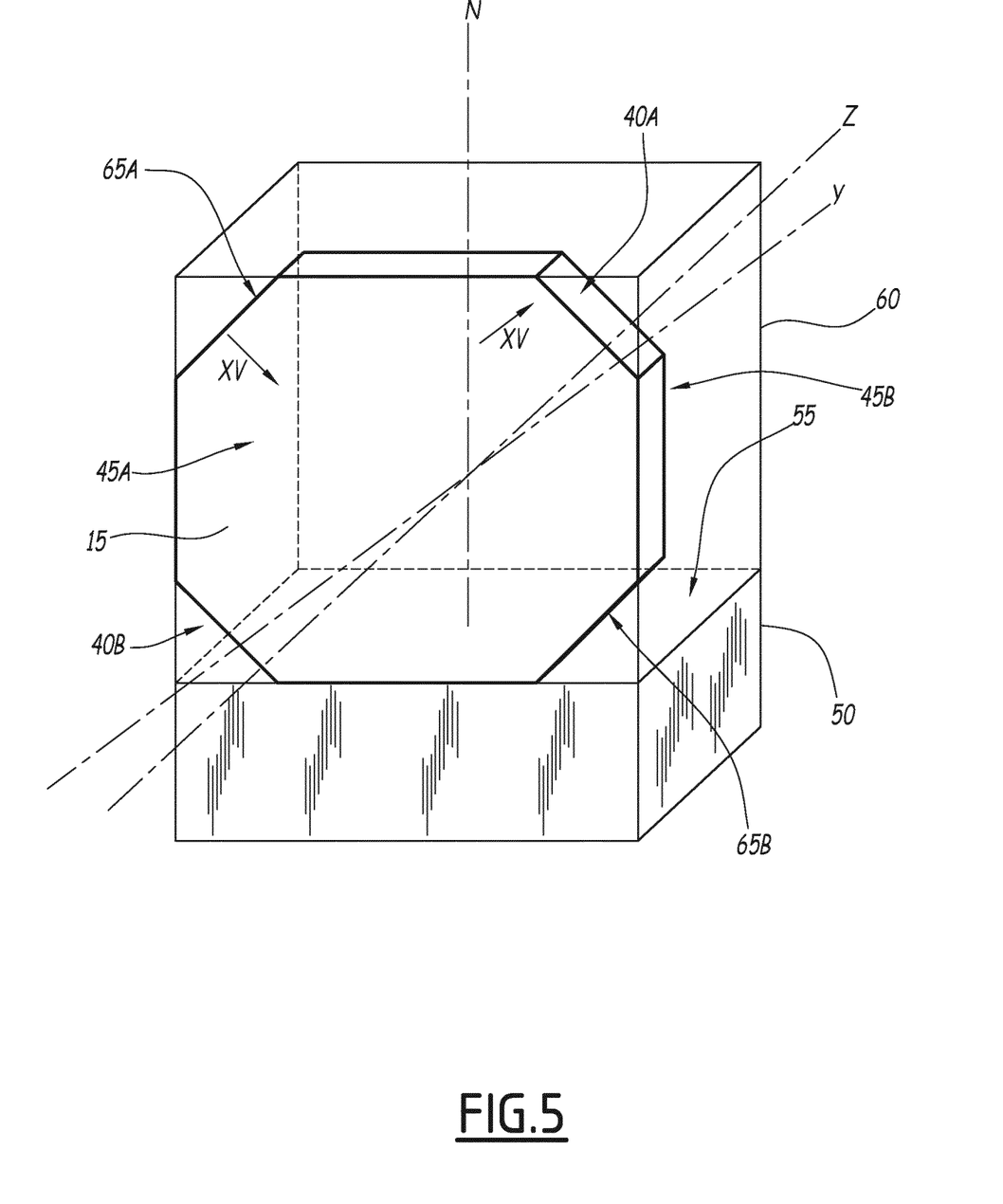
FIG. 5 is a schematic representation showing the production of another example of the crystal shown in FIG. 1 during the method shown in FIG. 2, from another example of a diamond crystalline layer.

According to a particular embodiment, shown in FIG. 5, the normal direction N is a direction [100] of the diamond crystal 15 and of the diamond layer. In such case, each second face 45 is perpendicular to a direction [110] of the diamond crystal 15 and of the diamond layer.

More particularly, the normal direction N and the direction [110] are perpendicular to each other. In such case, each laser cut made during the step 130 includes a laser radiation contained in a plane parallel to the normal direction N.

Each laser cutting, during the step 120, is carried out by means of laser radiation contained in a plane parallel to the direction Z (i.e. to the direction [110] of the diamond crystal 15 and of the diamond layer 60), and forming an angle of 54.74° with the normal direction N.

For example, a first laser cut is made in order to make the first face 40A appear, the first face being perpendicular to the direction [111] of the diamond crystal 15 and of the diamond layer 60, and optionally the first face 40B.

Optionally, a second laser cut is performed in order to reveal a third face 65A and/or a third face 65B, each third face 65A, 65B being perpendicular to the direction [-1-11] of the diamond crystal 15 and of the diamond layer 60. Thereby, each third face 65A, 65B is perpendicular to a second set of XV centers, the main direction of the second set being perpendicular to the direction [-1-11] of the diamond crystal 15 and of the diamond layer 60.

In the embodiment shown in FIG. 5, it is thereby possible to exploit the presence of two populations of XV centers the axis of which is contained in the same diamond crystal 15.

It should be noted that since the directions [-1-11] and [111] of the diamond crystal 15 and of the diamond layer 60 form an angle of 109.47° with each other, the XV centers of the first set are little coupled to a laser which would be injected through one of the third faces 65A, 65B, perpendicular to said face, and the XV centers of the second set are little coupled to the laser generated by the generator 20 and injected through the first face 40A. Thereby, the presence of two sets of XV centers does not reduce the sensitivity of the device 10. The same is true for the other 2 populations of NV centers [1-1-1] and [-11-1] which also form an angle of 109.47° with the main direction of interest.

Furthermore, since the faces 45A, 45B, perpendicular to the directions [110], are perpendicular to the support face 55, it is easy to cut the diamond crystal 15 in the diamond layer 60. Moreover, a large number of diamond crystals 15 can easily be obtained from the same diamond layer 60.

Moreover, the embodiment shown in FIG. 5 can be used for obtaining diamond crystals 15 having a great length (greater than or equal to 2 mm, 3 mm or more) without requiring growth as long as in the preceding examples and without presuming such a large thickness of the crystalline layer 60. Thereby, the method for manufacturing the device 10 is made faster.

The invention claimed is:

1. A method of manufacturing a device including a diamond crystal, a first laser radiation generator and a second magnetic field generator, the first generator being configured for illuminating a first face of the crystal with laser radiation, the second generator being configured for changing a value of a magnetic field in at least a portion of the crystal, the method including the steps of comprising:
   supply of supplying a substrate having a support face, a normal direction being defined, the normal direction being perpendicular to the support face, face;
   growth of growing a diamond crystal layer on the support face, the layer having a crystal lattice, the layer comprising at least a first set of XV centers in the crystal lattice, each XV center being composed of an X atom substituted for a carbon atom and coupled to a vacancy V, the XV center being a color center in the crystal lattice, each XV center having a quantification axis, the quantification axis connecting the substituted atom to the vacancy, a main direction being defined for the first set, the axes of quantification of the XV centers of the first set being parallel to the main direction of the set considered, the normal direction being distinct from the main direction of the first set;
   removing a first portion of the diamond layer in order to reveal the first face, the first face being perpendicular to the main direction of the first set;
   removing a second portion of the diamond layer in order to reveal a second face, the second face being perpendicular to the first face, and face; and
   positioning, with respect to the diamond crystal, the first generator in a first position and the second generator in a second position, the first generator being configured so that the laser radiation is perpendicular to the first face when the first generator is in the first position, the second generator being configured so that the magnetic field is parallel to the main direction when the second generator is in the second position.

2. The method according to claim 1, wherein the normal direction is a first direction of the diamond crystal.

3. The method according to claim 2, wherein the second face is perpendicular to a second direction of the diamond crystal.

4. The method according to claim 2, wherein the second face is perpendicular to the first direction of the diamond crystal.

5. The method according to claim 1, wherein the normal direction is a first direction of the diamond crystal or a second direction of the diamond crystal.

6. The method according to claim 5, wherein the second face is perpendicular to a third direction of the diamond crystal.

7. The method according to claim 1, further comprising removing a third portion of the diamond layer in order to expose a third face parallel to the second face.

8. The method according to claim 7, wherein the diamond crystal is a blade extending in a plane parallel to the second face and the third face, the blade being delimited along a direction perpendicular to the plane by the second face and the third face.

9. The method according to claim 1, wherein the main direction is a first direction of the diamond crystal or a second direction of the diamond crystal.

10. The method according to claim 1, wherein the diamond layer has a thickness greater than or equal to 2 millimeters.

11. The method according to claim 1, wherein said growing comprises growing by chemical vapor deposition.

12. The method according claim 1, wherein said removing a first portion or said removing a second part comprises removing a portion of the diamond layer by laser cutting.

13. The method according to claim 1, further comprising removing a third portion of the diamond layer in order to expose a third face, the third face being perpendicular to the main direction of the first set, the diamond crystal being delimited along the main direction of the first set by the first face and the third face.

* * * * *

UNITED STATES PATENT AND TRADEMARK OFFICE
CERTIFICATE OF CORRECTION

| | | |
|---|---|---|
| PATENT NO. | : 12,241,177 B2 | Page 1 of 1 |
| APPLICATION NO. | : 18/556088 | |
| DATED | : March 4, 2025 | |
| INVENTOR(S) | : Debuisschert et al. | |

It is certified that error appears in the above-identified patent and that said Letters Patent is hereby corrected as shown below:

In the Claims

Please replace the text of Column 12, Line 12, Claim 1 with the following:
-- the crystal, the method comprising: --

Please replace the text of Column 12, Line 13, Claim 1 with the following:
-- supplying a substrate having a support face, a --

Please replace the text of Column 12, Line 15, Claim 1 with the following:
-- being perpendicular to the support face; --

Please replace the text of Column 12, Line 16, Claim 1 with the following:
-- growing a diamond crystal layer on the support --

Please replace the text of Column 12, Line 34, Claim 1 with the following:
-- dicular to the first face; --

Signed and Sealed this
Twenty-ninth Day of July, 2025

Coke Morgan Stewart
*Acting Director of the United States Patent and Trademark Office*